(12) United States Patent
Hsu

(10) Patent No.: US 7,170,144 B2
(45) Date of Patent: Jan. 30, 2007

(54) SYSTEM-ON-CHIP WITH SHIELD RINGS FOR SHIELDING FUNCTIONAL BLOCKS THEREIN FROM ELECTROMAGNETIC INTERFERENCE

(75) Inventor: Yu-Hao Hsu, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/906,583

(22) Filed: Feb. 25, 2005

(65) Prior Publication Data

US 2006/0192265 A1     Aug. 31, 2006

(51) Int. Cl.
*H01L 29/00* (2006.01)

(52) U.S. Cl. .................................. 257/499
(58) Field of Classification Search ............. 257/499
See application file for complete search history.

(56) References Cited

U.S. PATENT DOCUMENTS 6,998,712 B2 * 2/2006 Okada et al. ............... 257/758

2005/0065747 A1 * 3/2005 Premy et al. ............... 702/120
2005/0282381 A1 * 12/2005 Cohen et al. ............... 438/637

* cited by examiner

*Primary Examiner*—Lex H. Malsawma
(74) *Attorney, Agent, or Firm*—Winston Hsu

(57) ABSTRACT

A system-on-chip (SoC) that is immune to electromagnetic interference has block shield rings fabricated therein. The SoC includes a microprocessor core; an on-chip bus interface; an embedded memory block; and an analog/mixed-signal integrated circuit shielded by an EMI shield ring encircling the analog/mixed-signal integrated circuit for protecting the analog/mixed-signal integrated circuit from electromagnetic interference. The EMI shield ring is grounded and includes a metal rampart consisting of multi-layer metals and vias. A pickup diffusion is connected to the metal rampart. In one embodiment, the memory block is also shielded.

9 Claims, 4 Drawing Sheets

SYSTEM-ON-CHIP WITH SHIELD RINGS FOR SHIELDING FUNCTIONAL BLOCKS THEREIN FROM ELECTROMAGNETIC INTERFERENCE

BACKGROUND OF INVENTION

1. Field of the Invention

The present invention relates generally to the field of system-on-chip (SoC) technology and, more particularly, to a system-on-chip with shield rings surrounding the specific functional blocks such as analogy/mixed-signal, RF signal, and/or memory blocks for the purposes of eliminating electromagnetic or static electricity interference.

2. Description of the Prior Art

Today the functionality and economics of many consumer products are being transformed by "system-on-chip" (SoC) technology. The continuing increase in the transistor densities means that it is now possible to integrate the processor, peripherals and some or all of the system memory on a single chip.

For SoC applications, it is desirable to integrate many functional blocks into a single integrated circuit. The most commonly used blocks include a microprocessor or microcontroller, static random access memory (SRAM) blocks, non-volatile memory blocks, and various special function logic blocks.

Frequencies are continuously increasing, while integration trends are squeezing entire systems into extraordinary high circuit densities. Electromagnetic interference (EMI) and signal coupling caused by EMI are becoming exceptionally crucial issues in the design of modern SoC systems.

In light of the above, there is a need in this industry to provide a solution that the EMI problems can be addressed or eliminated as early as possible during the design phase both on the aspect of the cost and on aspect of the time-to-market of the products.

SUMMARY OF INVENTION

It is therefore a primary object of the present invention to provide an improved system-on-chip design to solve the above-mentioned problems.

It is another object of the present invention to provide a system-on-chip that is immune to electromagnetic interference and static electricity interference.

According to the claimed invention, a system-on-chip (SoC) with EMI shield rings therein is provided. The SoC at least includes a microprocessor core; an on-chip bus interface; an embedded memory block; and an analog/mixed-signal integrated circuit shielded by an EMI shield ring encircling the analog/mixed-signal integrated circuit for protecting the analog/mixed-signal integrated circuit from electromagnetic interference. The EMI shield ring is grounded and includes a metal rampart consisting of multi-layer metals and vias. A pickup diffusion is connected to the metal rampart.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
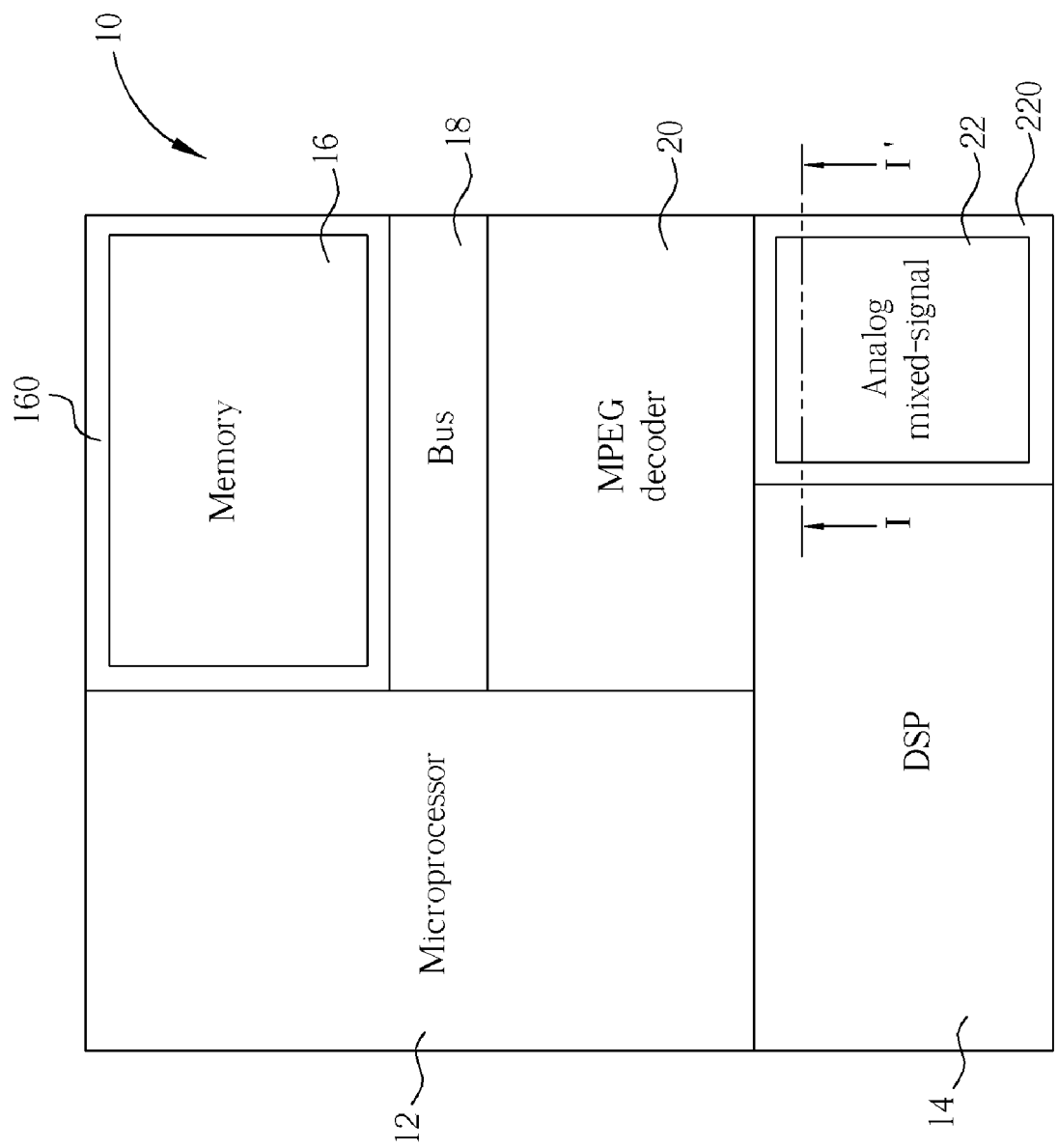
FIG. 1 is a schematic functional block diagram illustrating an exemplary system-on-chip (SoC) in accordance with one preferred embodiment of the present invention.

FIG. 1 is a schematic functional block diagram illustrating an exemplary system-on-chip (SoC) 10 in accordance with one preferred embodiment of the present invention. As shown in FIG. 1, the exemplary dual-core SoC 10, which may be suited to portable communications or multimedia applications, generally comprises an embedded processor core 12, a digital signal processor (DSP) 14, an on-chip memory block 16, an on-chip bus interface 18, an MPEG decoder 20, and an analog/mixed-signal block 22. The aforesaid functional blocks are integrated and fabricated on one single chip. It is to be understood that the configuration of the SoC 10 as set forth in FIG. 1 is presented only for illustration purposes, and should not be limiting. In another SoC configuration, an RF signal integrated circuit may be provided for other application purposes.

By way of example, the embedded processor core 12 may be a 16/32-bit RISC (abbr. of "reduced instruction set computer") microprocessor available from ARM limited. The on-chip memory block 16 may consist of a dynamic random access memory (DRAM), non-volatile memory (NVM) or the like. The salient feature of the present invention is that, as specifically indicated in FIG. 1, the on-chip memory block 16 is deliberately surrounded by a shield ring 160, and the analog/mixed-signal block 22 is deliberately surrounded by a shield ring 220.

In operation, the shield ring 160 and shield ring 220 are both grounded to create a screen to avoid signal coupling caused by electromagnetic interference resulting from the digital clock circuits that are driven at high speeds. To explain the aforesaid shield rings 160 and 220 in more detail, a schematic cross-section taken along line I–I' of FIG. 1 is demonstrated in FIG. 2.

Figure 2:
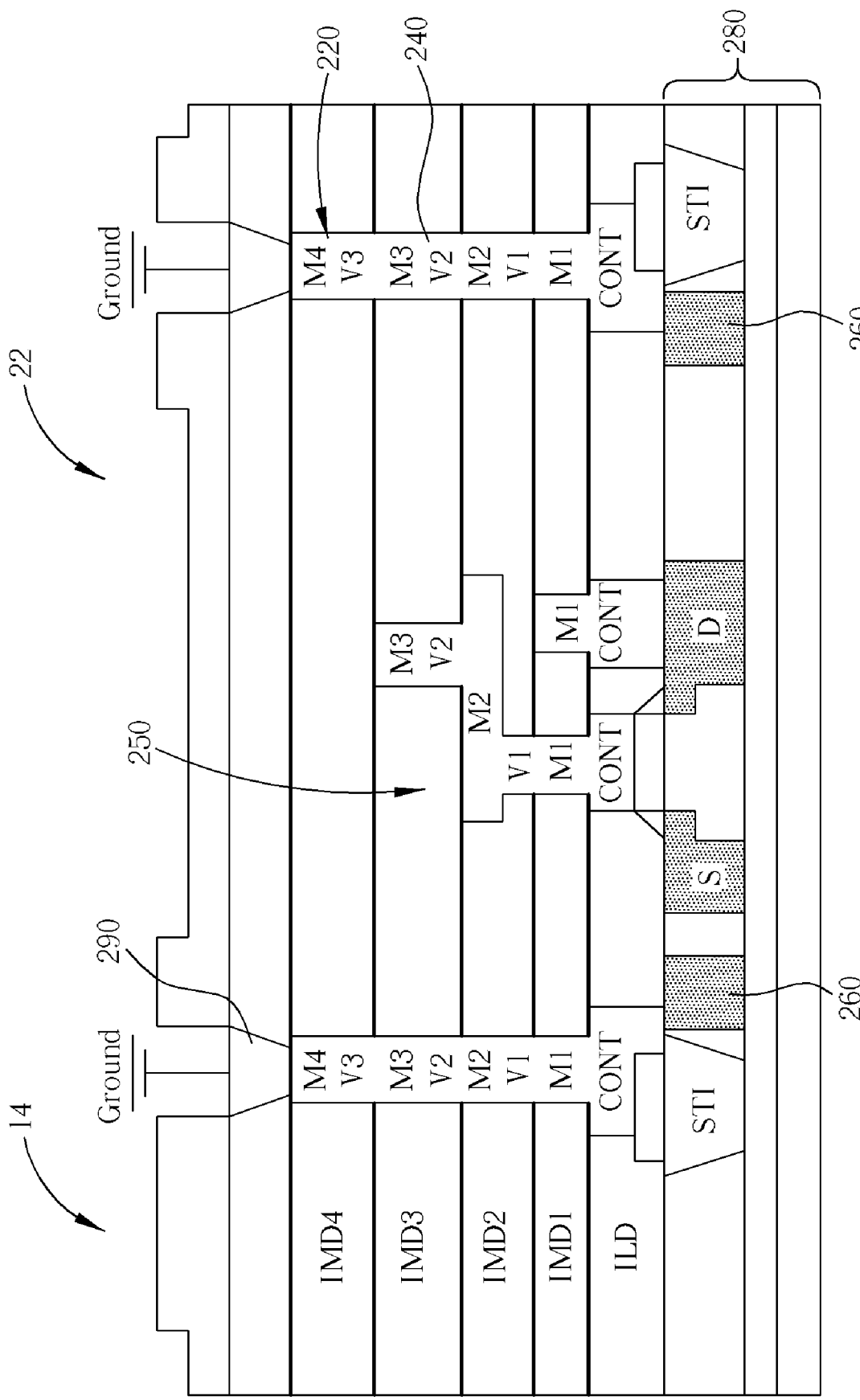
FIG. 2 is a schematic cross-section taken along line I–I' of FIG. 1.

As shown in FIG. 2, the demonstrated shield ring 220 comprises a metal rampart 240 encircling the schematic analog/mixed-signal integrated circuit 250. The metal rampart 240 is a stacked wall fabricated layer by layer including, from bottom to top, the contact layer (denoted as "CONT"), the first layer metal (M1), the first via layer (V1), the second layer metal (M2), the second via layer (V2), the third layer metal (M3), the third via layer (V3), and the fourth metal layer (M4). At the bottom of the shield ring 220, a pick up diffusion 260 is provided in the silicon-on insulator (SOI) substrate 280 to connect the metal rampart 240. The pick up diffusion 260 is implanted into the substrate 280 at positions adjacent to the shallow trench isolation (STI). At the top of the shield ring 220, a pad layer 290 is provided to connect the shield ring 220 with a ground line.

Figure 3:
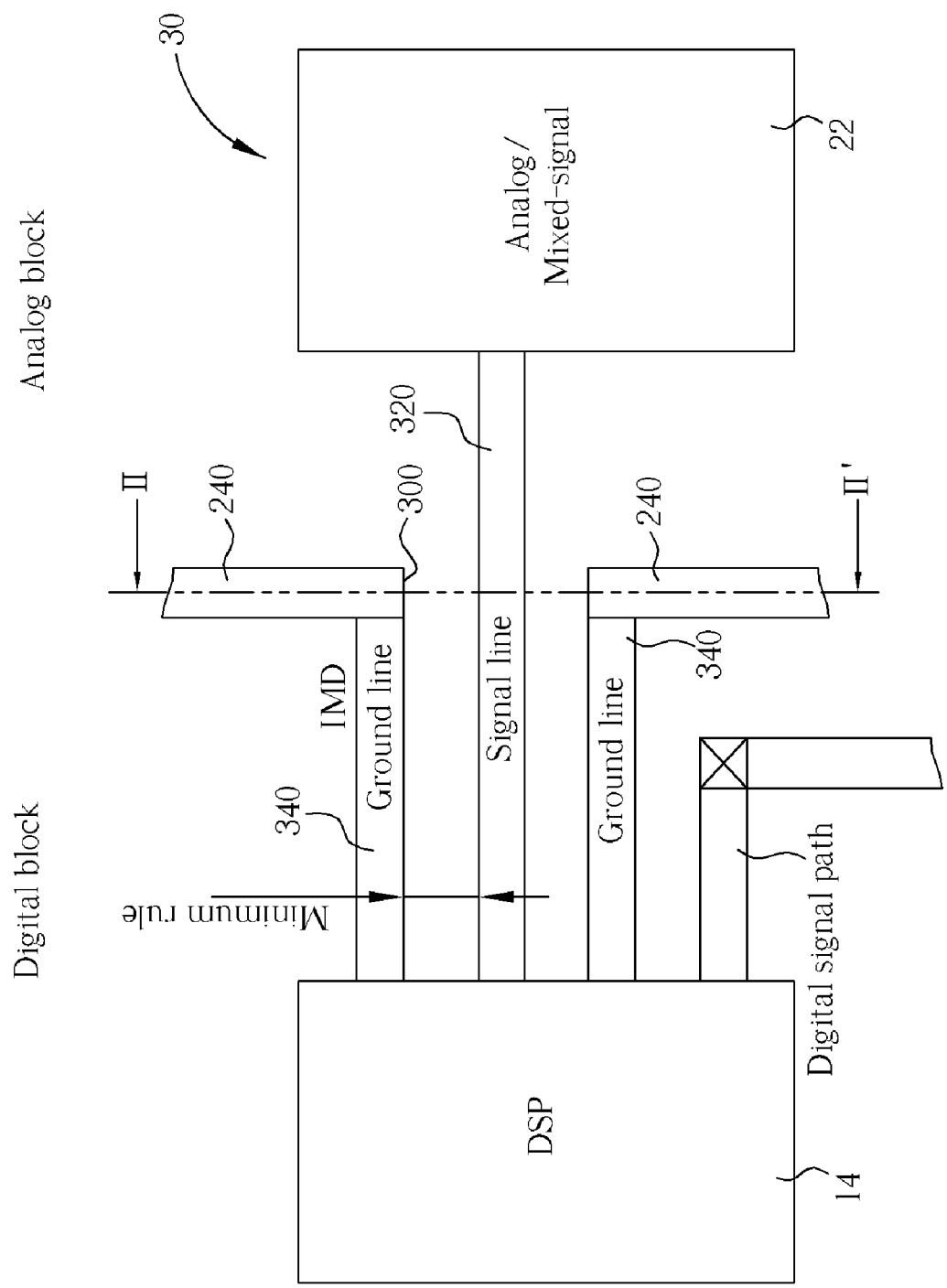
FIG. 3 is a schematic top view showing a portion of the shield ring at the analog/digital interface of the SoC.
Figure 4:
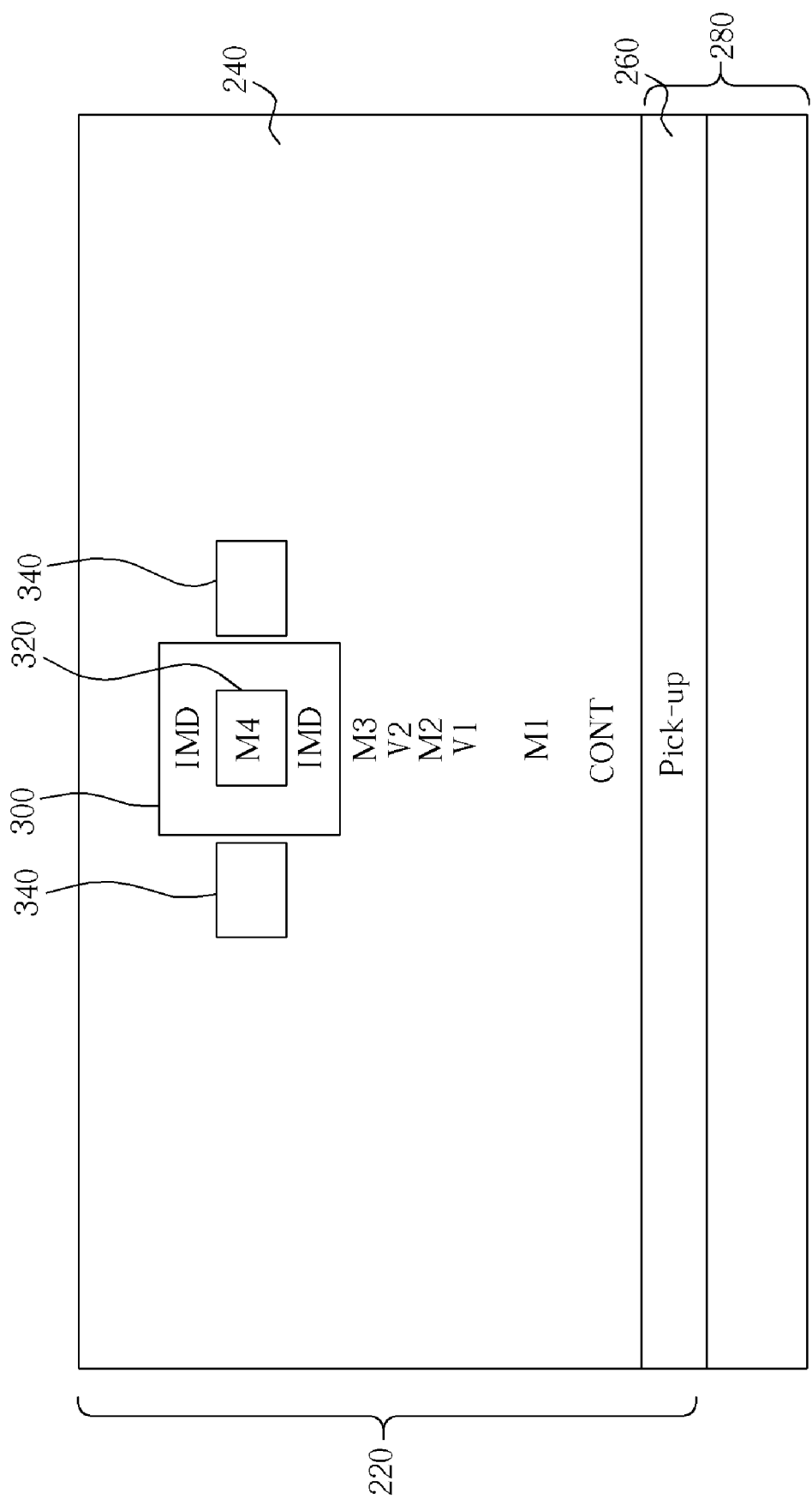
FIG. 4 is a cross-sectional view of FIG. 3 along line II–II'.

Please refer to FIG. 3 and FIG. 4. FIG. 3 is a schematic top view showing a portion of the shield ring at the analog/digital interface of the SoC. FIG. 4 is a cross-sectional view of FIG. 3 along line II–II'. As shown in FIG. 3 and FIG. 4, the metal rampart 240 consisting of multi-layer metals and vias has a digital/analogy (A/D) connection window 300, which allows DSP 14 to communicate with the shielded analog/mixed-signal block 22 through a signal line 320 passing therethrough. Preferably, the position of the A/D connection window 300 is remote from the main working signal line of the analog/mixed-signal integrated circuit.

Alternatively, as specifically indicated in FIG. 3, the signal line 320 may be accompanied with two adjacent grounded lines 340, which are formed at the same metal layer, for example, the fourth metal layer (M4), as the signal line 320, and are disposed at opposite sides of the signal line 320 with a minimum rule. By doing this, the signal coupling effect on the signal line 320, which results from the high-speed digital clock, can be alleviated.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A system-on-chip comprising:
   a microprocessor core;
   an on-chip bus interface;
   an embedded memory block; and
   an analog/mixed-signal integrated circuit shielded by a first shield ring encircling said analog/mixed-signal integrated circuit for protecting said analog/mixed-signal integrated circuit from electromagnetic interference, wherein said first shield ring comprises a metal rampart consisting of multi-layer metals and vias, and said metal rampart has an analog/digital (A/D) connection window that allows digital-to-analog communication, wherein a signal line passes through said A/D connection window.

2. The system-on-chip of claim 1 wherein said metal rampart is connected to a pickup diffusion implanted into a substrate.

3. The system-on-chip of claim 2 wherein said substrate is a silicon-on-insulator (SOI) substrate.

4. The system-on-chip of claim 1 wherein said signal line is accompanied with two adjacent grounded lines which are formed at the same metal layer as said signal line.

5. The system-on-chip of claim 1 wherein said first shield ring is grounded.

6. The system-on-chip of claim 1 wherein said embedded memory block is shielded by a grounded second shield ring encircling said embedded memory block.

7. The system-on-chip of claim 1 further comprising a digital signal processor (DSP) block.

8. The system-on-chip of claim 1 further comprising an MPEG decoder.

9. A system-on-chip comprising:
   a microprocessor core;
   an on-chip bus interface;
   an embedded memory block; and
   an RF signal integrated circuit shielded by a shield ring encircling said RF signal integrated circuit for protecting said RF signal integrated circuit from electromagnetic interference, wherein said shield ring comprises a metal rampart consisting of multi-layer metals and vias, and said metal rampart has an analog/digital (A/D) connection window that allows digital-to-analog communication, wherein a signal line passes through said A/D connection window.

\* \* \* \* \*